US 9,589,630 B2

(12) United States Patent
Zhou et al.

(10) Patent No.: US 9,589,630 B2
(45) Date of Patent: Mar. 7, 2017

(54) LOW VOLTAGE CURRENT REFERENCE GENERATOR FOR A SENSING AMPLIFIER

(71) Applicant: Silicon Storage Technology, Inc., San Jose, CA (US)

(72) Inventors: Yao Zhou, Shanghai (CN); Xiaozhou Qian, Shanghai (CN); Guangming Lin, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/435,251

(22) PCT Filed: Oct. 3, 2013

(86) PCT No.: PCT/US2013/063272
§ 371 (c)(1),
(2) Date: Apr. 13, 2015

(87) PCT Pub. No.: WO2014/070366
PCT Pub. Date: May 8, 2014

(65) Prior Publication Data
US 2015/0235711 A1    Aug. 20, 2015

(30) Foreign Application Priority Data

Oct. 29, 2012 (CN) .......................... 2012 1 0419802

(51) Int. Cl.
| G11C 11/56 | (2006.01) |
| G11C 7/12 | (2006.01) |
| G11C 16/28 | (2006.01) |
| G05F 3/26 | (2006.01) |
| G11C 5/14 | (2006.01) |

(52) U.S. Cl.
CPC ............ G11C 11/5642 (2013.01); G11C 7/12 (2013.01); G11C 16/28 (2013.01); G05F 3/262 (2013.01); G11C 5/147 (2013.01)

(58) Field of Classification Search
CPC ......... G11C 16/28; G11C 11/56; G11C 7/062; G11C 7/14; G11C 5/145; G11C 16/26; G11C 11/5642; G05F 3/30; G05F 3/262; H04B 1/0039; H04B 17/21; H04B 1/28
See application file for complete search history.

(56) References Cited

U.S. PATENT DOCUMENTS

| 4,713,797 A | 12/1987 | Morton et al. |
| 6,366,497 B1 * | 4/2002 | Guliani ................. G11C 16/28 |
| | | 365/185.21 |
| 6,885,574 B2 | 4/2005 | Torrisi et al. |

(Continued)

FOREIGN PATENT DOCUMENTS

EP    0 936 627 A1    8/1999

OTHER PUBLICATIONS

O. Charlon and W. Redman-White, Ultra High-Compliance CMOS Current Mirrors for Low Voltage Charge Pumps and References, pp. 227-230, IEEE 2004.

(Continued)

Primary Examiner — Richard Elms
Assistant Examiner — Ajay Ojha
(74) Attorney, Agent, or Firm — DLA Piper LLP (US)

(57) ABSTRACT

The invention comprises a non-volatile memory device with a sensing amplifier that includes a current mirror comprising a pair of resistors.

24 Claims, 5 Drawing Sheets

(56) References Cited

U.S. PATENT DOCUMENTS

| | | | |
|---|---|---|---|
| 7,016,245 B2 | 3/2006 | Balasubramanian et al. | |
| 7,515,493 B2 | 4/2009 | Di Vincenzo et al. | |
| 7,859,906 B1* | 12/2010 | Vispute | G11C 16/28 365/185.2 |
| 8,081,523 B2 | 12/2011 | Van Acht et al. | |
| 8,154,928 B2 | 4/2012 | Tran et al. | |
| 2003/0090926 A1 | 5/2003 | Torrisi et al. | |
| 2004/0062116 A1 | 4/2004 | Takano et al. | |
| 2004/0228162 A1 | 11/2004 | Pasotti et al. | |
| 2005/0169078 A1 | 8/2005 | Balasubramanian et al. | |
| 2005/0180188 A1* | 8/2005 | Bedeschi | G11C 7/12 365/145 |
| 2006/0023531 A1* | 2/2006 | Crippa | G11C 11/5642 365/203 |
| 2006/0125463 A1* | 6/2006 | Yen | G05F 3/262 323/316 |
| 2006/0202763 A1 | 9/2006 | Niki et al. | |
| 2007/0109157 A1 | 5/2007 | Lee et al. | |
| 2007/0285999 A1 | 12/2007 | Di Vincenzo et al. | |
| 2010/0103751 A1 | 4/2010 | Van Acht et al. | |
| 2010/0246267 A1* | 9/2010 | Hasler | G11C 5/147 365/185.15 |
| 2010/0265783 A1 | 10/2010 | Kern | |
| 2011/0058425 A1 | 3/2011 | Tran et al. | |

OTHER PUBLICATIONS

PCT Search Report and Written Opinion corresponding to the related PCT Patent Application No. US13/063272 dated Feb. 14, 2014.
Taiwanese Office Action (Taiwanese language only) and Search Report (English translation) dated Jul. 21, 2015 corresponding to the related Taiwanese Patent Application No. 102136325.

\* cited by examiner

US 9,589,630 B2

LOW VOLTAGE CURRENT REFERENCE GENERATOR FOR A SENSING AMPLIFIER

TECHNICAL FIELD

A non-volatile memory cell with an improved sensing amplifier is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sensing amplifiers. A sensing amplifier for this purpose is disclosed in U.S. Pat. No. 5,386,158 (the "'158 Patent"), which is incorporated herein by reference for all purposes. The '158 Patent discloses using a reference cell that draws a known amount of current. The '158 Patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sensing amplifier is disclosed in U.S. Pat. No. 5,910,914 (the "'914 Patent"), which is incorporated herein by reference for all purposes. The '914 Patent discloses a sensing circuit for a multi-level floating gate memory cell or MLC, which can store more than one bit of data. It discloses the use of multiple reference cells that are utilized to determine the value stored in the memory cell (e.g., 00, 01, 10, or 11). Current mirrors are utilized in this approach as well.

The current mirrors of the prior art utilize PMOS transistors. One characteristic of PMOS transistors is that a PMOS transistor can only be turned "on" if the voltage applied to the gate is less than the voltage threshold of the device, typically referred to as $V_{TH}$. One drawback of using current mirrors that utilize PMOS transistors is that the PMOS transistor causes a $V_{TH}$ drop. This hinders the ability of designers to create sensing amplifiers that operate at lower voltages.

Another drawback of the prior art design is that PMOS transistors are relatively slow when the gate transitions from high to low (i.e., when the PMOS transistor turns on). This results in delay of the overall sensing amplifier.

What is needed is an improved sensing circuit that operates using a lower voltage supply than in the prior art.

What is further needed is an improved sensing circuit where the voltage supply can be turned off when not in use to save power, but where the sensing circuit can become operational without a significant timing penalty once the voltage supply is turned back on.

SUMMARY OF THE INVENTION

The aforementioned problems and needs are addressed by providing a sensing circuit that utilizes a resistor pair instead of a transistor pair as a current mirror. The use of a resistor pair instead of a transistor pair enables the use of a lower voltage supply with a shorter startup time.

In one embodiment, a reference cell current is applied to a current mirror. The mirrored current is coupled to the selected memory cell. The mirrored current is compared to the selected memory cell current, and a sense output is generated that indicates the state of the memory cell (e.g., 0 or 1) and that is directly related to the relative size of the current through the selected memory cell compared to the reference current.

In another embodiment, a mirror pair block is added between the current mirror and the selected memory cell.

Other objects and features of the present invention will become apparent by a review of the specification, claims and appended figures.

DETAILED DESCRIPTION OF THE PREFERRED EMBODIMENTS

Figure 1:
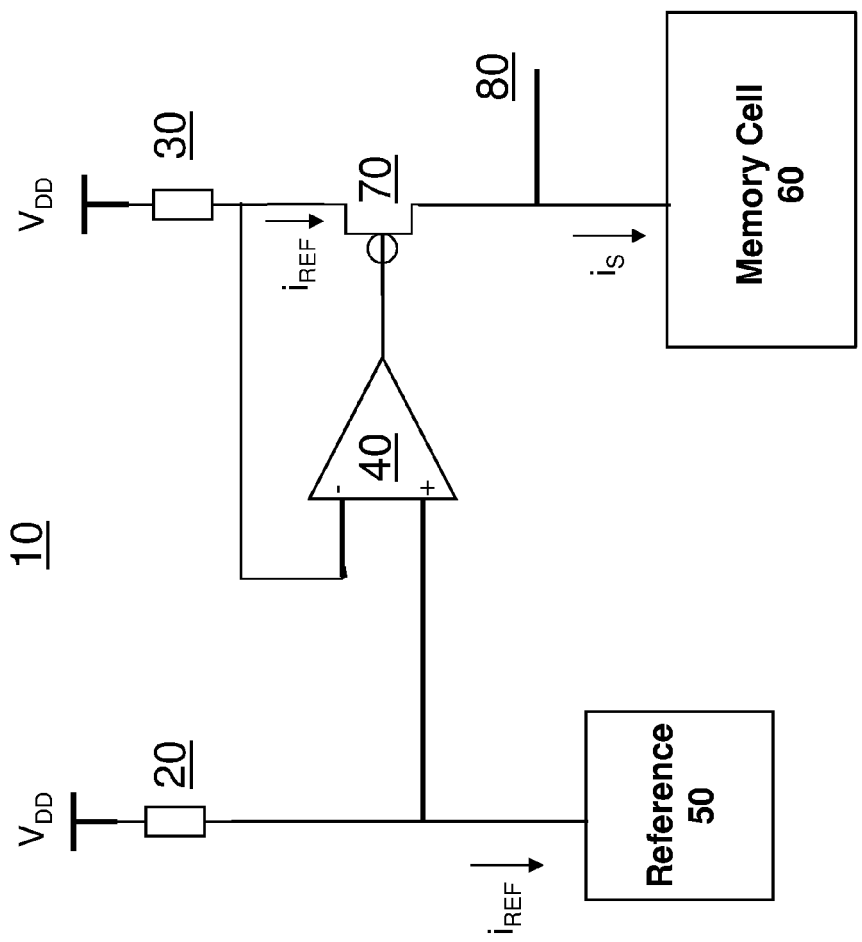
FIG. 1 depicts a block diagram of a sensing circuit embodiment that includes a current mirror that comprises a pair of resistors.

An embodiment will now be described with reference to FIG. 1.

Sensing circuit 10 is shown. A power supply, $V_{DD}$, is provided to resistor 20 and resistor 30. Resistor 20 is coupled to one positive terminal of operational amplifier 40. Resistor 30 is coupled to another terminal of operational amplifier 40. Operational amplifier 40 acts as a clamp loop. The output of operational amplifier 40 is coupled to the gate of PMOS transistor 70. The source of PMOS transistor 70 is coupled to resistor 30. The drain of PMOS transistor 70 is coupled to memory cell 60. Resistor 20 is also coupled to reference circuit 50. As can be seen, resistor 20 and resistor 30 each have a first terminal and a second terminal. The source, drain, and gate of PMOS transistor 70 also are terminals.

Reference circuit 50 will draw a set amount of current, $i_{REF}$. The current through resistor 20 will be $i_{REF}$. Because operational amplifier 40 acts as a clamp loop, the voltage drop across resistor 20 and resistor 30 will be the same, and they therefore will form a current mirror, and the current through resistor 30 also will be $i_{REF}$ (or a multiple thereof, if the values of resistor 20 and resistor 30 are not equal).

In operation, memory cell 60 will draw a level of current, $i_S$, that depends upon the value stored in the memory cell. For example, memory cell 60 might draw a low amount of current if it is storing a "0" and a high amount of current if it is storing a "1."

In this example, if $i_{REF} > i_S$, then sense output 80 will have a relatively high voltage. If $i_{REF} < i_S$, then sense output 80 will have a relatively low voltage. Thus, if the value stored in memory cell 60 is "0," then $i_S$ will be relatively low and $i_{REF}$ will be greater than $i_S$, meaning that sense output 80 will have a high voltage representing a "1." If the value stored in memory cell 60 is "1," then $i_S$ will be relatively high and $i_{REF}$ will be less than $i_S$, meaning that sense output 80 will have a low voltage representing a "0." Thus, sense output 80 is the inverse of the value stored in memory cell 60. Optionally, sense output 80 can be coupled to an inverter (not shown), where the inventor would then output a value that directly corresponds to the value stored in memory cell 60.

In this example, because the current mirror is created using paired resistors instead of paired transistors, $V_{DD}$ can be a lower voltage than in a system using paired transistors. This design allows $V_{DD}$ to be able to operate at a voltage of less than 1.0V. For example, the disclosed embodiments can operate at a minimum voltage of around 0.9V.

Figure 2:
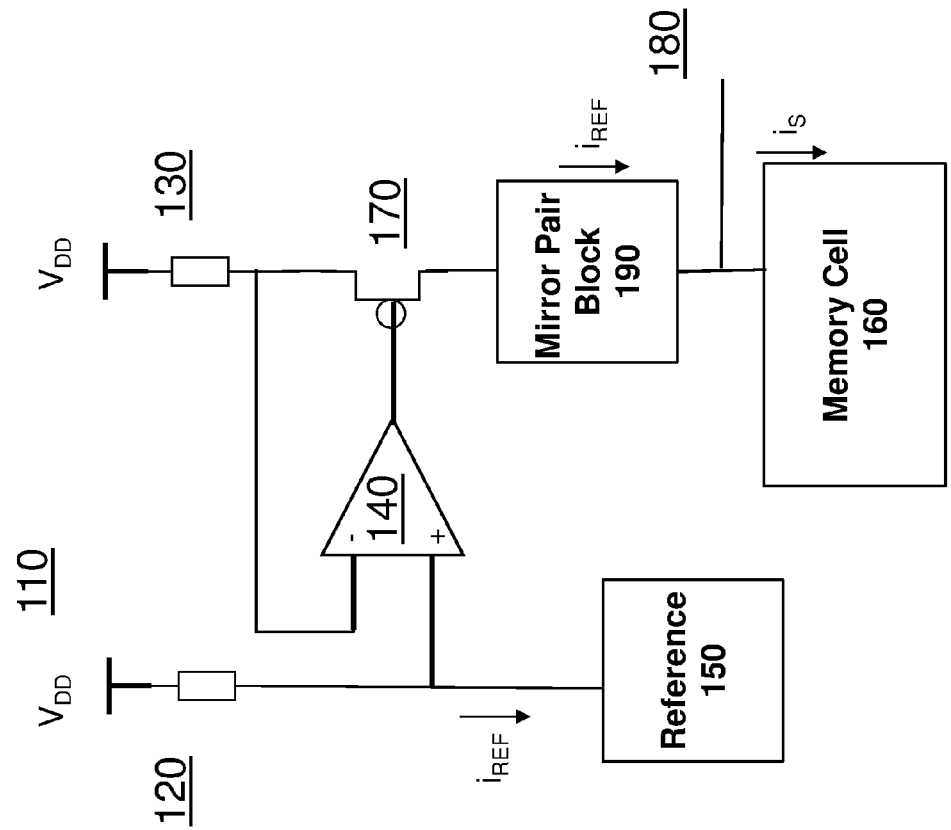
FIG. 2 depicts a block diagram of another sensing circuit embodiment that includes a current mirror that comprises a pair of resistors.

A different embodiment will now be described with reference to FIG. 2. Sensing circuit 110 is shown. A power supply, $V_{DD}$, is provided to resistor 120 and resistor 130. Resistor 120 is coupled to the positive terminal of operational amplifier 140. Resistor 130 is coupled to the negative terminal of operational amplifier 140. Operational amplifier 140 acts as a clamp loop. The output of operational amplifier 140 is coupled to the gate of PMOS transistor 170. The source of PMOS transistor 170 is coupled to resistor 130. The drain of PMOS transistor 70 is coupled to mirror pair block 190. Mirror pair memory block 190 is coupled to memory cell 160. Sense output 180 is the output of sensing circuit 110 and is a port by which the output can be obtained. As can be seen, resistor 120 and resistor 130 each have a first terminal and a second terminal. The source, drain, and gate of PMOS transistor 170 also are terminals.

Reference circuit 150 will draw a set amount of current, $i_{REF}$. The current through resistor 120 will be $i_{REF}$. Because operational amplifier 140 acts as a clamp loop, the voltage drop across resistor 120 and resistor 130 will be the same, and they therefore will form a current mirror, and the current through resistor 130 also will be $i_{REF}$ (or a multiple thereof, depending upon the values of resistor 120 and resistor 130).

In operation, memory cell 160 will draw a level of current, $i_S$, that depends upon the value stored in the memory cell. For example, memory cell 60 might draw a low amount of current if it is storing a "0" and a high amount of current if it is storing a "1."

Figure 3:
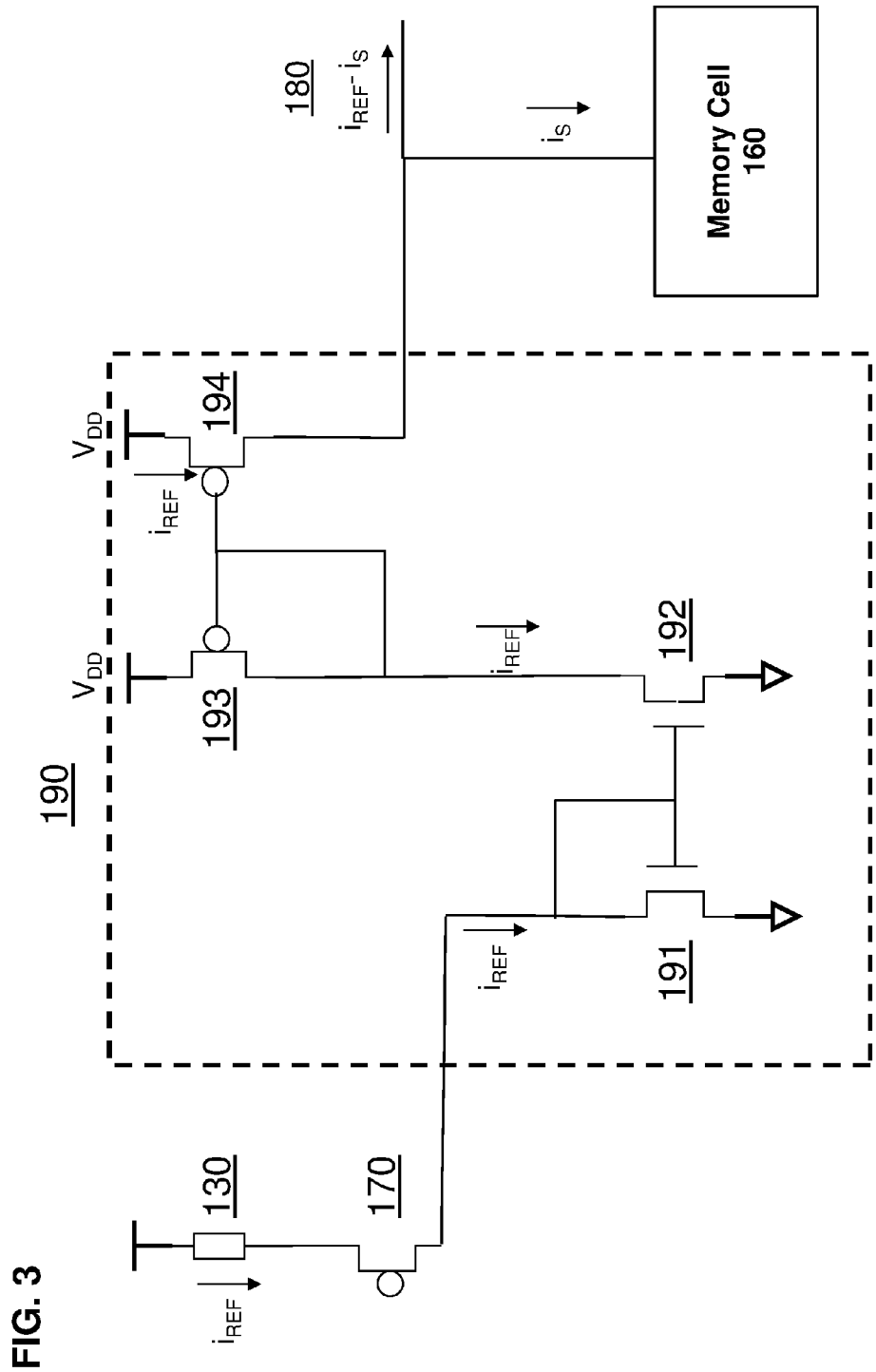
FIG. 3 depicts an embodiment of a mirror pair block.

Additional detail on mirror pair block 190 will now be described with reference to FIG. 3. Here, we again see resistor 130 and PMOS transistor 170 as we did in FIG. 2. The drain of PMOS transistor 170 is coupled to the input of mirror pair block 190. The input will be current $i_{REF}$. Mirror pair block 190 comprises NMOS transistor 191 and NMOS transistor 192, which are configured as a current mirror. The gates of NMOS transistor 191 and NMOS transistor 192 are coupled together to the gate of NMOS transistor 191, and the drains of NMOS transistor 191 and NMOS transistor 192 are coupled to ground. The voltage drop from gate to drain will be the same for NMOS transistor 191 and NMOS transistor 192, and the current through NMOS transistor 192 therefore also will be $i_{REF}$ (or a multiple thereof, depending on the characteristics of NMOS transistor 191 and NMOS transistor 192).

Mirror pair block 190 comprises PMOS transistor 193 and PMOS transistor 194. The sources of PMOS transistor 193 and PMOS transistor 194 are connected to $V_{DD}$. The gates of PMOS transistor 193 and PMOS transistor 194 are connected together and to the drains of PMOS transistor 193, which in turn connects to the source of NMOS transistor 192. The voltage drop from the source-to-gate junction in PMOS transistor 193 and PMOS transistor 194 will be the same. Therefore, PMOS transistor 193 and PMOS transistor 194 will act as a current mirror, and the current through PMOS transistor 194 also will be $i_{REF}$ (or a multiple thereof, depending on the characteristics of PMOS transistor 193 and PMOS transistor 194). The drain of PMOS transistor 194 is coupled to sense output 180, which in turn is connected to memory cell 160.

The current through sense output 180 will be $i_{REF} - i_S$. If $i_S > i_{REF}$, then this value will be negative, and sense output 180 will detect a low voltage (i.e., a "0"). If $i_S < i_{REF}$, then this value will be positive, and sense output 180 will detect a high voltage (i.e., a "1"). Thus, sense output 180 is the inverse of the value stored in memory cell 160. Optionally, sense output 180 can be coupled to an inverter (not shown), where the inventor would then output a value that directly corresponds to the value stored in memory cell 160.

Figure 4:
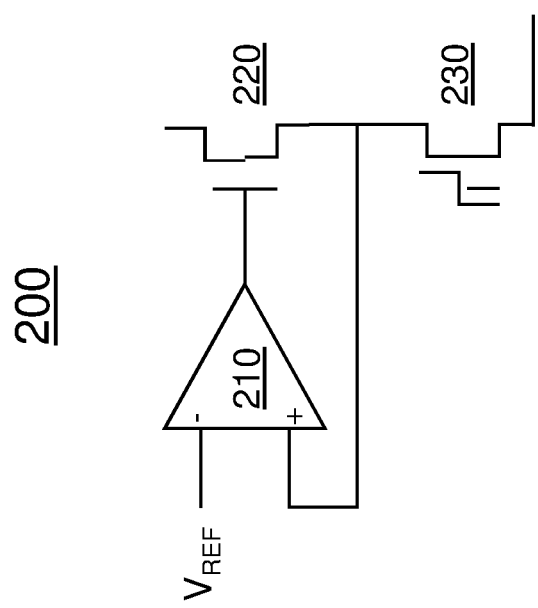
FIG. 4 depicts an embodiment of a reference circuit.

FIG. 4 shows an embodiment of a reference circuit, shown as reference circuit 200. Reference circuit 200 can be used for reference circuit 50 or 150, discussed previously. Reference circuit 200 comprises operation amplifier 210. The negative node of operational amplifier 210 is connected to a voltage source (not shown) generating a voltage VREF. VREF can be, for example, 0.8 volts. The output of operational amplifier 210 is connected to the gate of NMOS transistor. The drain of NMOS transistor 220 is the input of the reference circuit 200. The source of NMOS transistor 220 connects to reference memory cell 230.

Figure 5:
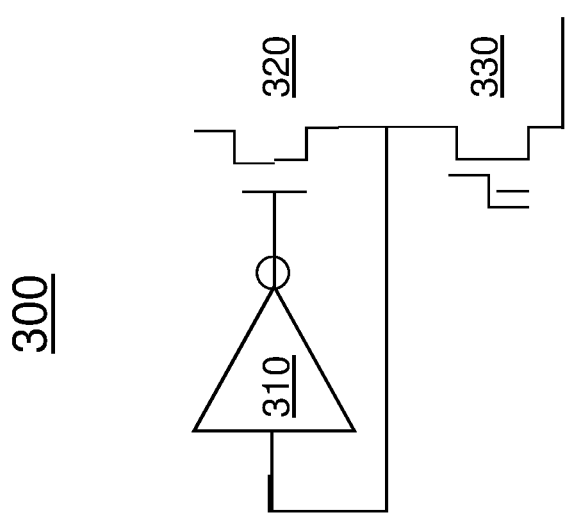
FIG. 5 depicts another embodiment of a reference circuit.

FIG. 5 shows another embodiment of a reference circuit, shown as reference circuit 300. Reference circuit 300 can be used for reference circuit 50 or 150, discussed previously. Reference circuit 300 comprises inverter 310. The output of inverter 310 is connected to the gate of PMOS transistor 320. The source of PMOS transistor is the input of the reference circuit 200. The drain of PMOS transistor is connected to reference memory cell 330 and is the input to inverter 310.

Optionally, reference circuit 50 or reference circuit 150 could each comprise a current source circuit. Examples of current source circuits suitable for this purpose are well-known to those of ordinary skill in the art References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. An apparatus for use in a memory device, comprising:
    a current mirror comprising a first resistor and a second resistor, the first resistor comprising a first terminal and second terminal and the second resistor comprising a first terminal and a second terminal;
    a voltage source coupled to the first terminal of the first resistor and coupled to the first terminal of the second resistor;
    a reference circuit coupled to the second terminal of the first resistor;

a PMOS transistor comprising a first terminal and a second terminal, wherein the first terminal of the PMOS transistor is coupled to the second terminal of the second resistor;

a selected memory cell coupled to the second terminal of the PMOS transistor;

wherein the second terminal of the PMOS transistor provides a voltage indicative of the value stored in the selected memory cell in response to a first current drawn by the reference circuit and a second current drawn by the selected memory cell.

2. The apparatus of claim 1, wherein the voltage source provides a voltage of 1.0 volts or less.

3. The apparatus of claim 1, wherein the selected memory cell is a floating gate memory cell.

4. The apparatus of claim 1, wherein the reference circuit comprises a reference memory cell.

5. The apparatus of claim 4, wherein the reference memory cell is a floating gate memory cell.

6. The apparatus of claim 4, wherein the reference circuit comprises an operational amplifier.

7. The apparatus of claim 4, wherein the reference circuit comprises an inverter.

8. The apparatus of claim 1, wherein the reference circuit comprises a current source.

9. An apparatus for use in a memory device, comprising:
a first resistor, wherein a first terminal of the first resistor is coupled to a voltage source;
a reference circuit coupled to a second terminal of the first resistor;
a second resistor, wherein a first terminal of the second resistor is coupled to the voltage source;
an operational amplifier, wherein a positive input terminal of the operational amplifier is coupled to a second terminal of the first resistor and a negative input terminal of the operational amplifier is coupled to a second terminal of the second resistor;
a PMOS transistor comprising a first terminal, a second terminal, and a third terminal, wherein the first terminal of the PMOS transistor is coupled to a second terminal of the second resistor and the third terminal of the PMOS transistor is coupled to an output of the operational amplifier;
a selected memory cell coupled to the second terminal of the PMOS transistor;
wherein the drain of the PMOS transistor provides a voltage indicative of the value stored in the selected memory cell in response to a first current drawn by the reference circuit and a second current drawn by the selected memory cell.

10. The apparatus of claim 9, wherein the voltage source provides a voltage of 1.0 volts or less.

11. The apparatus of claim 9, wherein the selected memory cell is a floating gate memory cell.

12. The apparatus of claim 9, wherein the reference circuit comprises a reference memory cell.

13. The apparatus of claim 12, wherein the reference memory cell is a floating gate memory cell.

14. The apparatus of claim 12, wherein the reference circuit comprises an operational amplifier.

15. The apparatus of claim 12, wherein the reference circuit comprises an inverter.

16. The apparatus of claim 9, wherein the reference circuit comprises a current source.

17. An apparatus for use in a memory device, comprising:
a first resistor, wherein a first terminal of the first resistor is coupled to a voltage source;
a reference circuit coupled to a second terminal of the first resistor;
a second resistor, wherein a first terminal of the second resistor is coupled to the voltage source;
an operational amplifier, wherein a positive input terminal of the operational amplifier is coupled to a second terminal of the first resistor and a negative input terminal of the operational amplifier is coupled to a second terminal of the second resistor;
a PMOS transistor, wherein a first terminal of the PMOS transistor is coupled to a second terminal of the second resistor and a third terminal of the PMOS transistor is coupled to an output of the operational amplifier;
a mirror pair block comprising a first terminal and second terminal, wherein the first terminal of the mirror pair block is coupled to the second terminal of the PMOS transistor and the second terminal of the mirror pair block is coupled to a selected memory cell;
an output port, coupled to the second terminal of the mirror pair block, that provides a voltage indicative of the value stored in the selected memory cell.

18. The apparatus of claim 17, wherein the voltage source provides a voltage of 1.0 volts or less.

19. The apparatus of claim 17, wherein the selected memory cell is a floating gate memory cell.

20. The apparatus of claim 17, wherein the reference circuit comprises a reference memory cell.

21. The apparatus of claim 20, wherein the reference memory cell is a floating gate memory cell.

22. The apparatus of claim 20, wherein the reference circuit comprises an operational amplifier.

23. The apparatus of claim 20, wherein the reference circuit comprises an inverter.

24. The apparatus of claim 17, wherein the reference circuit comprises a current source.

* * * * *